(12) United States Patent
Lederer et al.

(10) Patent No.: US 8,338,942 B2
(45) Date of Patent: Dec. 25, 2012

(54) POWER SEMICONDUCTOR MODULE WITH CONNECTION ELEMENTS ELECTRICALLY INSULATED FROM ONE ANOTHER

(75) Inventors: Marco Lederer, Nürnberg (DE); Rainer Popp, Petersaurach (DE)

(73) Assignee: Semikron Elektronik GmbH & Co. KG, Nürnberg (DE)

( * ) Notice: Subject to any disclaimer, the term of this patent is extended or adjusted under 35 U.S.C. 154(b) by 0 days.

(21) Appl. No.: 11/818,288

(22) Filed: Jun. 14, 2007

(65) Prior Publication Data
US 2008/0007918 A1    Jan. 10, 2008

(30) Foreign Application Priority Data
Jun. 14, 2006 (DE) .......................... 10 2006 027 481

(51) Int. Cl.
*H01L 23/12* (2006.01)
(52) U.S. Cl. .................. 257/700; 257/E23.01
(58) Field of Classification Search .................. 428/378, 428/379, 375, 403, 458; 257/E21.477, E31.476, 257/700
See application file for complete search history.

(56) References Cited

U.S. PATENT DOCUMENTS

| | | | |
|---|---|---|---|
| 4,313,128 A | | 1/1982 | Schlegel et al. |
| 5,017,859 A | * | 5/1991 | Engel et al. .................. 324/127 |
| 5,438,479 A | | 8/1995 | Heilbronner |
| 5,811,878 A | * | 9/1998 | Harmoinen et al. .......... 257/723 |
| 5,856,913 A | * | 1/1999 | Heilbronner .................. 361/760 |
| 2005/0280490 A1 | * | 12/2005 | Uchiyama et al. ............. 336/90 |
| 2007/0216013 A1 | * | 9/2007 | Funakoshi et al. ............ 257/691 |

FOREIGN PATENT DOCUMENTS

| | | |
|---|---|---|
| DE | 197 19 703 | 11/1998 |
| DE | 199 03 875 | 8/2000 |
| DE | 101 27 947 | 10/2002 |
| EP | 0 828 341 | 3/1998 |

* cited by examiner

*Primary Examiner* — Marcos D. Pizarro
*Assistant Examiner* — Eva Yan Montalvo
(74) *Attorney, Agent, or Firm* — The Law Office of Roger S. Thompson

(57) ABSTRACT

A power semiconductor module, for placement on a cooling component. The module includes a substrate, at least two power semiconductor components arranged on the substrate, a housing and outwardly routed load and control connections. The substrate has an insulator body with a first main area that faces the interior of the power semiconductor module, and has interconnects at load potential arranged thereon. Each load connection is formed as a shaped metal body with outer contacts, a strip-like section and with inner contacts extending from the strip-like section to the substrate and making circuit-compliant contact therewith. In addition, the load connections are substantially completely encased by insulation except in the vicinity of the outer and inner contacts and accordingly are electrically insulated from one another.

10 Claims, 3 Drawing Sheets

POWER SEMICONDUCTOR MODULE WITH CONNECTION ELEMENTS ELECTRICALLY INSULATED FROM ONE ANOTHER

BACKGROUND OF THE INVENTION

1. Field of the Invention

The invention is directed to a power semiconductor module in pressure-contact form for placement on a cooling component.

2. Description of the Related Art

Known power semiconductor modules such as disclosed in German Published. Application no. DE 197 19 703 A1 comprise a housing having at least one electrically insulating substrate arranged therein, preferably for direct assembly on a cooling component. The substrate comprises an insulator body having a plurality of metal interconnects thereon, which interconnects are insulated from one another, and also power semiconductor components thereon which are circuit connected to these interconnects in circuit-compliant fashion. In addition, known power semiconductor modules have connections for external load and auxiliary connections and connects arranged in the interior thereof. These connections for circuit-compliant connections in the interior of the power semiconductor module are usually in the form of wire bonding connections.

Similarly known are power semiconductor modules with pressure contact, as are known from U.S. Pat. No. 5,438,479 and German Published Application No. DE 199 03 875 A1 or German Patent No. DE 101 27 947 C1. In the case of the first document mentioned, the pressure device has a stable, preferably metal, pressure element for pressure setup, an elastic cushion for pressure storage and a bridge for introducing pressure to separate regions of the substrate surface. The bridge is preferably in the form of a molded plastic body with an area which faces the cushion and from which a multiplicity of pressure fingers extend in the direction of the substrate surface.

A pressure device of this kind pushes the substrate onto a cooling component and hence reliably produces permanent heat transfer between the substrate and the cooling component. In this case, the elastic cushion maintains constant pressure conditions under different thermal loads and over the entire life cycle of the power semiconductor module.

DE 199 03 875 A1 develops the known pressure element such that it firstly has a particularly advantageous ratio of weight and stability and secondly has electrically insulated bushings. To this end, the pressure element is formed as a molded plastic body with an internal metal core. This metal core has recesses to permit connection elements to pass therethrough, preferably auxiliary connection elements in spring contact form. The plastic body surrounds these recesses such that the auxiliary connection elements are electrically insulated from the metal core by the plastic body.

Further pressure elements are also known which have a multiplicity of pressure fingers on their surface facing the substrate. Preferably, the metal core in this context also has a preset sag. In the combination of both measures, a pressure element of this kind can provide the entire functionality of a pressure device as stated above.

German Patent No. DE 101 57 947 C1 discloses a power semiconductor module, in which the load connection elements are in a form such that sections thereof run very close to one another at right angles to the substrate surface and they have inner contact devices, contact feet, extending therefrom which make the electrical contact with the interconnects and simultaneously exert pressure on the substrate and hence make the thermal contact between the latter and a cooling component. In this case, the pressure is introduced by known means.

SUMMARY OF THE INVENTION

It is an object of the invention to present a power semiconductor module in pressure contact form, with an improved inner insulation of the power semiconductor and a simplified design.

Briefly stated, in a preferred embodiment of the invention, a power semiconductor module in pressure contact form is disposed on a cooling component. The module has at least one substrate, at least two power semiconductor components, for example bipolar transistors, arranged thereon, a housing and outwardly routed load and control connections. The substrate itself has an insulator body with a first main area. The first main area faces the interior of the power semiconductor module, and has interconnects at load potential. In addition, the substrate preferably also has at least one interconnect at control potential for actuating the power semiconductor components.

The power semiconductor module also has load connections, formed as a shaped metal body with outer and inner contact devices and a strip-like section. The respective strip-like sections of the individual load connections are preferably arranged parallel to the substrate surface and at a distance therefrom. The inner contact devices which begin at the strip-like section extend to the substrate, where they make circuit-compliant contacts for the load connections. Preferably, they achieve this on the substrate by making contact with the interconnects at load potential, alternatively also directly with the power semiconductor components.

In line with the invention, the load connections have an insulated casing. With the exception of the regions of the outer and inner contact devices, the load connections are preferably substantially completely encased by this insulator and at the same time therefore are electrically insulated from one another. In addition, it is particularly preferred if the encased load connections form a stack which therefore represents a production unit.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
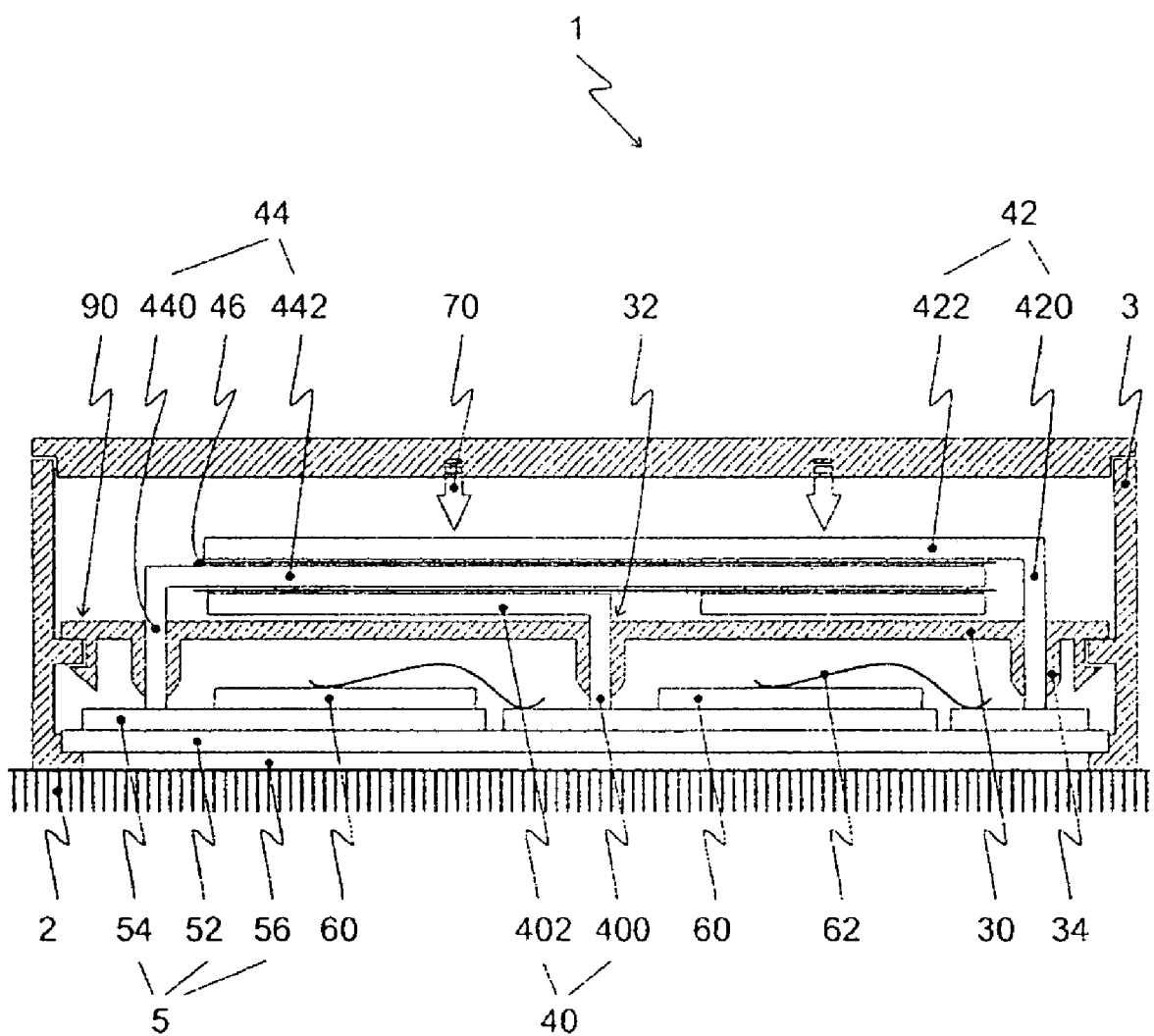
FIG. 1 is a section through a power semiconductor module of the prior art.

FIG. 1 shows a section through a power semiconductor module 1 of the prior art. This power semiconductor module 1 has a housing 3 with a frame-like housing part. In this case, the frame-like housing part surrounds at least one substrate 5. Substrate 5 in turn has an insulator body 52, preferably formed of an insulating ceramic, such as aluminium oxide or aluminium nitrite.

Substrate 5 main area, faces the interior of power semiconductor module 1, with an inherently patterned metal lining. In this case, the individual sections of this metal lining, which is preferably made of copper, form interconnects 54 of the power semiconductor module 1. The second main area of substrate 5 has an unpatterned copper lining 56, as known in the prior art.

Interconnects 54 of substrate 5 have controllable and/or uncontrolled power semiconductor components 60 arranged thereon, such as IGBTs (Insulated Gate Bipolar Transistors) with respective back-to-back connected freewheeling diodes, or MOSFETs. These are circuit connected to other interconnects 54 in circuit-compliant fashion, for example by means of wire bonding connections 62.

The load connections 40, 42, 44 for the various potentials, which occur in the power semiconductor module, are used for the external connection of the power-electronics circuit inside power semiconductor module 1. To this end, load connections 40, 42, 44 are in the form of shaped metal bodies which respectively have a strip-like section 402, 422, 442 in parallel with the substrate surface. In this case, strip-like sections 402, 422, 442 form a stack, with the strip-like sections of the individual load connections 40, 42, 44 being spaced apart from one another exclusively by layers of insulation 46, for example in the form of plastic films. Such plastic films are respectively arranged between adjacent connections in order to ensure the electrical insulation of the different potentials of the connections. Requisite auxiliary connections have not been shown in this drawing for clarity.

In addition, power semiconductor module 1 has an intermediate layer, in the form of an insulator shaped body 30, between the stack of strip-like sections 402, 422, 442 of the load connections 40, 42, 44 and the substrate 5. In this refinement, this insulator shaped body 30 is arranged in the frame-like housing 3 using a snap-lock connection 90.

Insulator shaped body 30 for its part has recesses 32 therein for permitting the passage therethrough of inner contact connections, in this case contact feet 400, 420, 440, of the load connections 40, 42, 44. It is particularly preferred if these recesses 32 are in the form of guides for contact feet 400, 420, 440, which improves the positioning of the load connection elements 40, 42, 44 relative to substrate 5 or to its interconnects 54.

A pressure device 70 for thermally connecting power semiconductor module 1 to a cooling component 2 and at the same time for electrically connecting load connections 40, 42, 44 to the interconnects 54 of substrate 5 is formed, by way of example, by a pressure element for the pressure setup and also by an elastic cushion for pressure storage. The pressure is introduced to the stack of strip-like sections 402, 422, 442 of the load connections 40, 42, 44 via the cushion and therefore exerts pressure on contact feet 400, 420, 440. This causes these feet to be electrically conductively connected to interconnects 54.

Such pressure devices 70 have been found to provide particularly reliable contact over the life of power semiconductor modules 1. Another advantage for pressure contact connection is the recesses 32 in the insulator shaped body 30 being formed as guides, since this means that the positioning of contact feet 400, 420, 440 is particularly accurate.

By way of example, the pressure element is in the form of a shaped plastic body with a suitable internal metal core, in which case it is also possible to dispense with a cushion to store pressure. It is also preferred if the pressure element simultaneously forms the cover of the power semiconductor module 1.

Figure 2:
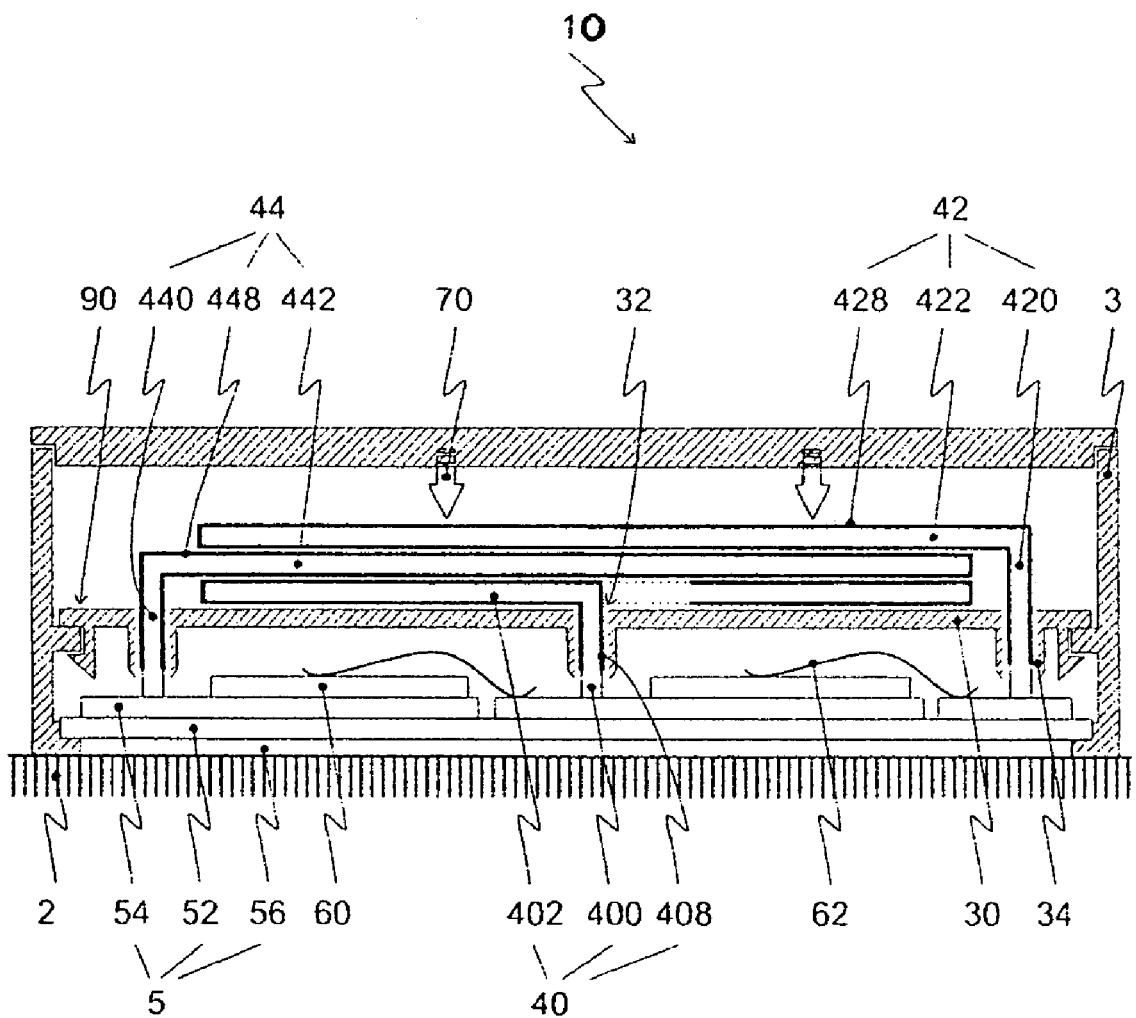
FIG. 2 is a section through a power semiconductor module in accordance with the invention.

FIG. 2 shows a section through a power semiconductor module 10 according to the invention. In this exemplary embodiment, substrate 5, housing 3 and pressure device 70 are similar to the respective components of the prior art, and this means that the invention is not limited to this embodiment, specifically to the embodiment of the power semiconductor module being in pressure contact form.

The form of the metal shaped bodies of load connections 40, 42, 44 likewise corresponds to the prior art. In contrast thereto, load connections 40, 42, 44 are developed, in line with the invention, such that they each have an insulating casing 408, 428, 448, respectively. This casing encases respective load connections 40, 42, 44 more or less completely. Casing 408 has parts of contact devices 400, 420, 440, for example for the interconnects 54, cut out from it.

This form of the inventive load connections 40, 42, 44 means that it is possible to dispense with the arrangement of plastic films between the load connection elements. This simplifies the design and construction of power semiconductor module 10 in a first step. A further simplification for this design is obtained if load connections 40, 42, 44 form a stack 4 in the region of strip-like sections 402, 422, 442. This can be done, by way of example, by bonding the individual load connection elements 40, 42, 44 already encased with insulators 408, 428, 448. It may also be particularly preferred if a plurality of load connections 40, 42, 44 are encased with insulation in one step.

Figure 3:
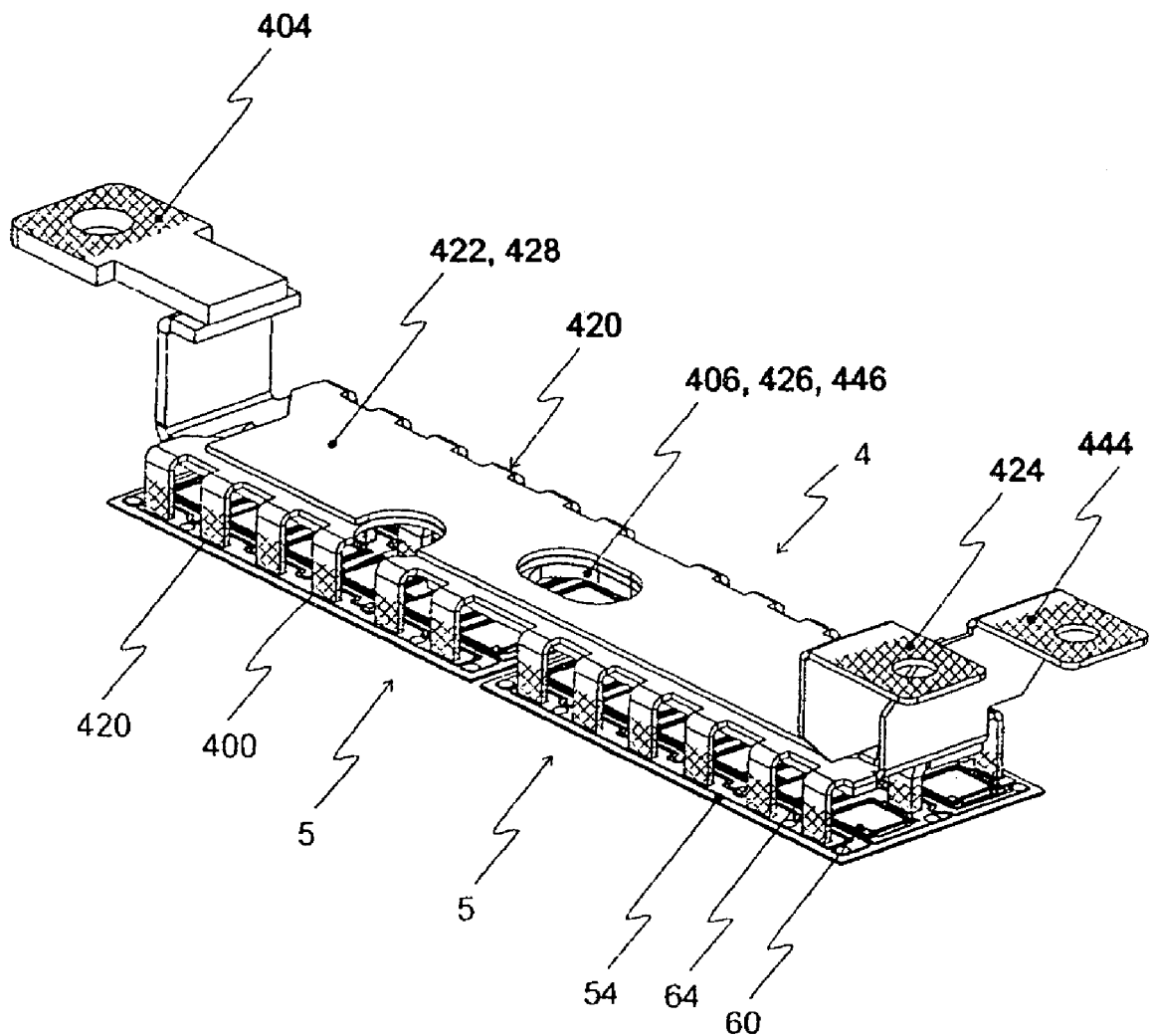
FIG. 3 is a perspective view of a stack of load connection elements in a power semiconductor module in accordance with the invention.

FIG. 3 shows a three-dimensional illustration of a stack 4 of load connections 40, 42, 44 in a power semiconductor module in accordance with the invention. The figure shows load connections 40, 42, 44 which respectively have a plurality of inner contact devices, contact feet 400, 420, 440, which start from associated strip-like sections 402, 422, 442 and in this case make circuit-compliant contact with two substrates 5 electrically connected in parallel. Further, outer, contacts 404, 424, 444 of load connections 40, 42, 44 form the external connections of the power semiconductor module.

In this embodiment, load connections 40, 42, 44 are encased by an insulator 408, 428, 448 almost completely. This casing does not cover parts of the contacts 400, 420, 440 which contact interconnects 54 of substrate 5 or outer contacts 404, 424, 444 for the external electrical connection of the power semiconductor module.

It may be preferred for exclusively the contact areas of load contacts 40, 42, 44 with interconnects 54 not to be covered by insulation in the case of contact feet 400, 420, 440 of load connections 40, 42, 44 for interconnects 54 of substrate 5. It may likewise be possible, as illustrated here, for a section of contact feet 400, 420, 440 which extends from the substrate surface not to be encased. This region does not absolutely require insulation, or insulation can be formed by a potting compound, preferably made of a silicon gel, which is arranged inside the power semiconductor module, for example.

The outer contact devices 404, 424, 444 for making contact externally are not encased with insulation at least on the respective contact area for the electrically conductive connection. In this case too, the insulating casing may have a cutout starting from the respective contact area in the direction of the respective strip-like section 402, 422, 442. The exact form of casing 408, 428, 448 is dependent on the respective requirements from the insulation of the load connections 40, 42, 44 relative to one another and on the geometric form of the power semiconductor module, for example on housing.

It is particularly advantageous if the respective casing 408, 428, 448 of the individual load connections 40, 42, 44 is formed using an injection-molding or dipping process. As a requirement for the insulator itself, for example, a polyamide-based thermoplastic, with a tracking resistance with a CTI value of at least about 400, even more preferably if at least about 600, has been found to be particularly suitable.

It is also particularly advantageous if the load connections 40, 42, 44 are preferably connected in the region of the strip-like sections 402, 422, 442 to form an assembly unit. This can be produced, by way of example, by connecting the individual load connections 40, 42, 44 encased with insulation 408, 428, 448 through bonding. However, it may also be preferred to encase a plurality of, or even advantageouslys all, load connections 40, 42, 44 with insulating casing 408, 428, 448, respectively, in a joint process step. This produces an assembly unit which is particularly advantageous to process.

In addition, the respective load connections 40, 42, 44 or a stack 4 of load connections 40, 42, 44 formed therefrom have recesses 406, 426, 446 preferably in the region of strip-like sections 402, 422, 442. These recesses 406, 426, 446 are designed for permitting passage therethrough of auxiliary connections (not shown), which are advantageously in the form of helical springs. In this case, the edges of the recesses 406, 426, 446 formed are likewise encased with the insulating casing 408, 428, 448.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module, for placement on a cooling component, comprising:
    a substrate having an insulator body with a first main area, the first main area of the insulator body facing the interior of the power semiconductor module, and also having interconnects at load potential arranged thereon;
    at least two power semiconductor components arranged on the substrate;
    a housing positioned around the substrate; and
    outwardly routed load connections each having a shaped metal body with an outer contact device, a strip-like section and an inner contact that extends from the strip-like section to the substrate making circuit-compliant contact therewith; and
    control connections;
    wherein the load connections are disposed so as to form a stack in the region of the strip-like sections; and
    wherein each individual load connection is substantially completely encased by an insulator except in the vicinity of the inner and outer contacts and are accordingly thereby electrically insulated from one another.

2. The power semiconductor module of claim 1, further comprising a pressure device disposed in the module to maintain the elements thereof in contact.

3. The power semiconductor module of claim 1, wherein the insulator has a CTI value of at least about 400.

4. The power semiconductor module of claim 1, wherein the insulator is formed via a dipping process.

5. The power semiconductor module of claim 1, wherein the insulator is formed via an injection-molding process.

6. The power semiconductor module of claim 1, wherein the stack is formed by bonding.

7. The power semiconductor module of claim 1, wherein the stack is formed by simultaneously arranging the insulation on a plurality of load connections.

8. The power semiconductor module of claim 1, further comprising:
    a pressure device disposed in the module to maintain the elements thereof in contact; and
    wherein at least one of the pressure device and the stack have recesses for permitting the passage therethrough of auxiliary connections.

9. The power semiconductor module of claim 1, wherein insulation is applied to the stack by dipping.

10. The power semiconductor module of claim 1, wherein insulation is applied to the stack by spraying.

* * * * *